United States Patent [19]

Slough

[11] 4,266,187
[45] May 5, 1981

[54] METHOD AND APPARATUS FOR MEASURING EFFECTIVENESS OF A CORROSION INHIBITOR

[75] Inventor: Carlton M. Slough, Spring, Tex.

[73] Assignee: Texaco Inc., White Plains, N.Y.

[21] Appl. No.: 32,598

[22] Filed: Apr. 23, 1979

[51] Int. Cl.³ .............................................. G01R 27/02
[52] U.S. Cl. .............................. 324/65 CR; 324/71 R; 324/442; 324/449
[58] Field of Search .............. 324/65 CR, 65 R, 62 R, 324/71 E, 71 R, 442, 446, 449

[56] References Cited

U.S. PATENT DOCUMENTS

| | | | |
|---|---|---|---|
| 2,824,283 | 2/1958 | Ellison | 324/71 X |
| 3,047,847 | 7/1962 | Marsh et al. | 324/65 CR |
| 3,406,101 | 10/1968 | Kilpatrick | 324/65 CR |
| 3,609,549 | 9/1971 | Hausler et al. | 324/71 R X |
| 3,757,210 | 9/1973 | Hansen et al. | 324/65 CR X |
| 3,909,709 | 9/1975 | Maxon | 324/65 R X |

*Primary Examiner*—Stanley T. Krawczewicz
*Attorney, Agent, or Firm*—Carl G. Ries; Robert A. Kulason; Henry C. Dearborn

[57] ABSTRACT

A simple, low cost test instrument for measuring effectiveness of a corrosion inhibiting film. It employs solid state integrated circuits and applies an AC signal across the film. The amplitude of the signal is less than that which would damage the film, and the electrical resistance is a measure of the inhibitor effectiveness.

7 Claims, 2 Drawing Figures

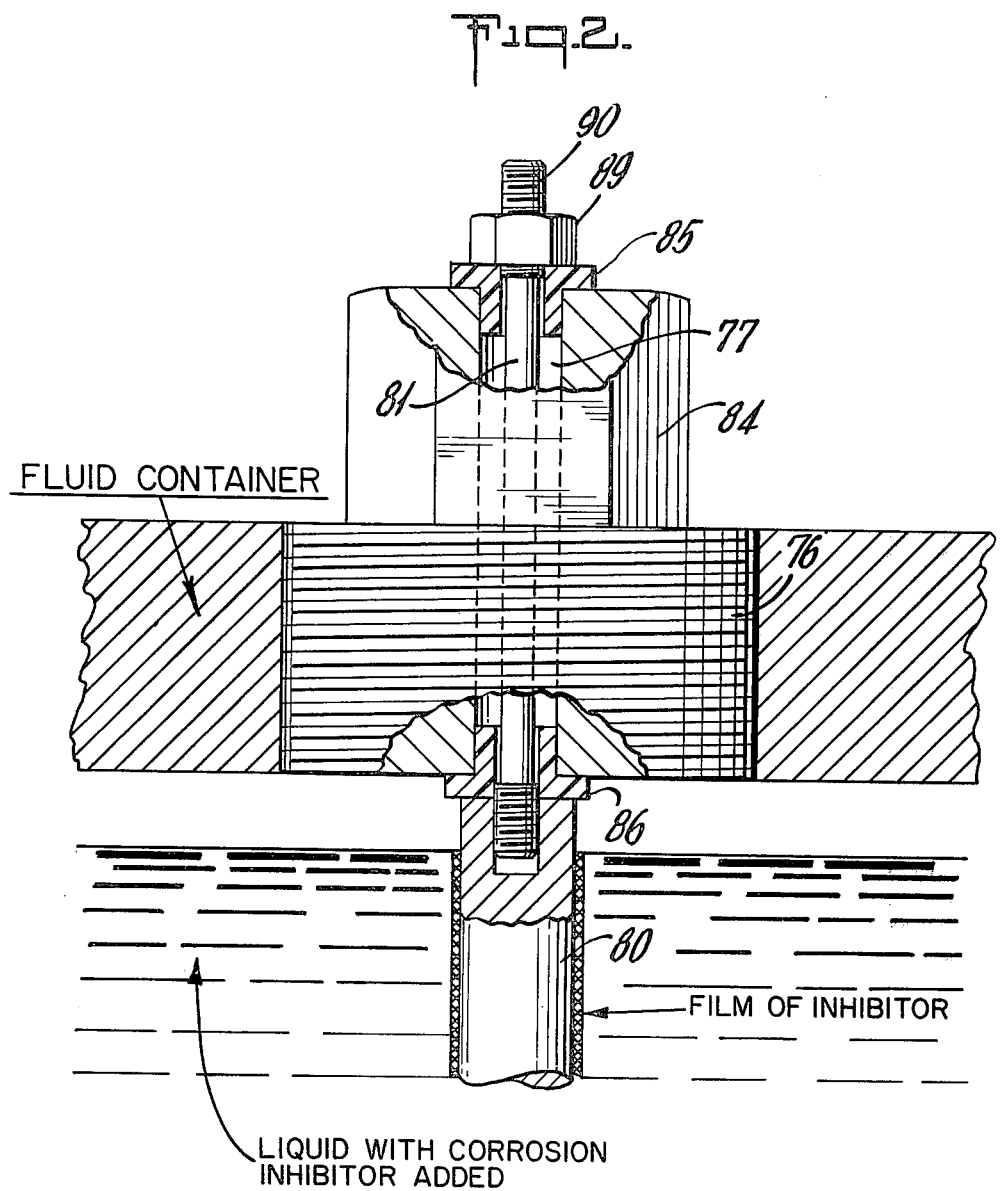

METHOD AND APPARATUS FOR MEASURING EFFECTIVENESS OF A CORROSION INHIBITOR

BACKGROUND OF THE INVENTION

1. Field of the Invention

This invention concerns an instrument for measuring the protection afforded by a corrosion inhibiting material. More specifically, it deals with an electrical measuring instrument that can measure the effectiveness of a corrosion inhibitor by determining the electrical resistance of the film that is created by such inhibitor, in a corroding system.

2. Description of the Prior Art

While there is known laboratory instrumentation which is capable of making measurements comparable to those desired by this invention, such instrumentation is relatively complex and delicate and quite expensive. Furthermore, such instrumentation is not readily usable in general field use, which is where the desired measurements would be taken.

Heretofore, there have been some suggestions for making measurements in order to determine the resistance of fluids, e.g. gasoline, in case water content is suspected. But, the arrangement proposed in that case dealt with measurements of the current flow through the fluid directly. And, particular measures were taken to avoid any polarization or electrolysis which might tend to cause surface effects and so change the impedance of the fluid. Consequently, that proposal failed to recognize, or in any way suggest something in accordance with this invention. A patent which disclosed a system of the foregoing type is U.S. Pat. No. 3,909,709, issued Sept. 30, 1975 to Leroy J. Maxon.

Thus, it is an object of this invention to provide a relatively inexpensive and simple, yet highly accurate and useful method and apparatus for measuring the effectiveness of a corrosion inhibitor, especially where the inhibition is created by a film on the surface which would tend to corrode.

SUMMARY OF THE INVENTION

Briefly, the invention concerns a test instrument for measuring effectiveness of a corrosion inhibitor in a corroding system. It comprises an oscillator for generating an AC signal across a voltage divider, and circuit means for connecting a predetermined portion of said AC signal to the input of an ideal rectifier through a film of said inhibitor. It also comprises means for amplifying the output of said ideal rectifier to measure the flow of AC current through said film.

Again briefly, the invention concerns a test instrument for measuring effectiveness of a corrosion inhibitor in a corroding system which comprises a solid-state oscillator employing an integrated circuit with a plurality of resistors and a capacitor to generate a square wave output of about 8 volts at about 100 hertz. It also comprises a voltage divider connected across the output of said oscillator to reduce said output to about 8/10ths volt. And, it comprises an ideal rectifier including an integrated circuit amplifier in series with a diode rectifier. Also, the ideal recitifier has a feedback connection around both said amplifier and rectifier in order to compensate for the loss in the rectifier. It also comprises a second integrated circuit amplifier having two inputs and an output, one of said amplifier inputs being connected to the output of said ideal rectifier. The other of said amplifier inputs is connected to an adjustable signal for calibrating the zero output of said instrument. It also comprises a microammeter connected to the output of said second integrated circuit amplifier in order to indicate said inhibitor effectiveness.

Once more briefly, the invention concerns a method of measuring corrosion inhibitor effectiveness by determining impedance of a film formed by said inhibitor on a metallic surface contacted by a liquid containing said inhibitor. The method comprises immersing a metallic probe in said liquid, and electrically insulating said probe from a container for said liquid. It also comprises applying a low voltage AC square wave voltage across said film, with said voltage having an amplitude of less than that which will damage said film. It also comprises measuring the resistance of said film.

BRIEF DESCRIPTION OF THE DRAWINGS

The foregoing and other objects and benefits of the invention will be more fully set forth below in connection with the best mode contemplated by the inventor of carrying out the invention, and in connection with which there are illustrations provided in the drawings, wherein:

FIG. 2 is a schematic showing, partially in cross-section illustrating a typical probe structure to be used with a test instrument according to the invention.

DESCRIPTION OF THE PREFERRED EMBODIMENT

Figure 1:
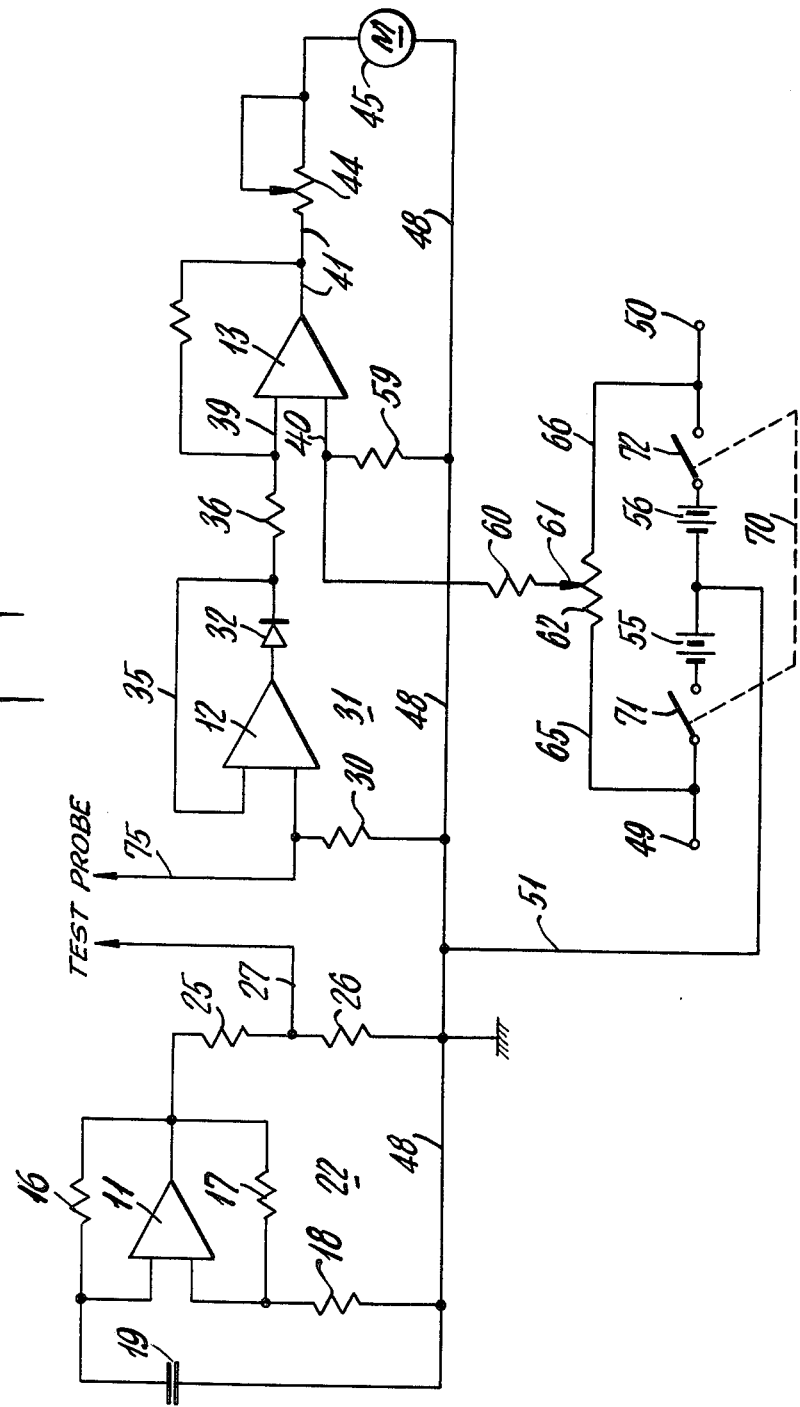
FIG. 1 is a circuit diagram illustrating a typical test instrument according to the invention.

An instrument according to this invention is particularly valuable in permitting an independent determination of inhibitor effectiveness in a corrosive system that is supplied with an inhibitor to avoid corrosive effects. By providing a method and/or system according to this invention, the measurements of effectiveness may be employed in order to avoid over-treating with a corrosion inhibitor. Consequently, it can save considerable cost in unnecessary use of too much inhibitor.

An instrument according to the invention is useful in any system where a simple electrically insulated probe can be installed so that it is immersed in the system fluid. It may be noted that the fluid must contain some water as a conductive phase for the electrical measurement that is being carried out.

Laboratory tests have shown that inhibitor effectiveness can be related to the impedance of the inhibitor film. No impedance indicated poor corrosion control, and high impedance indicates good control. The measured impedance range from about 10 to more than 3,000 ohms. But, as indicated above, the type of laboratory instrumentation which is able to make such a measurement is very expensive and not appropriate for widespread field use. On the other hand, an instrument according to this invention is lightweight and relatively simple, as well as quite inexpensive, so that in practice measuring probes may be permanently installed at desired locations and one instrument can service an entire system or field where the measurements of inhibitor effectiveness are desired. Such film impedance determination is simple to carry out and requires less than two minutes.

Referring to FIG. 1, it will be observed that there are three integrated circuits 11, 12 and 13. These may be commercially available elements, and they are preferably those designated by the commercial number 741.

The integrated circuit 11 is used with three resistors 16, 17 and 18 as well as a capacitor 19, to form a solid state oscillator 22. The oscillator 22 is designed to generate an AC square wave about 8 volts in amplitude at approximately 100 hertz.

The output of the oscillator 22 is connected across a voltage divider made up of a pair of resistors 25 and 26, which are chosen so as to redue the voltage on an output circuit connection 27 to an amplitude which is less than that which will damage the film formed by the inhibitor. In the preferred embodiment, such output voltage is about 0.8 volts. That voltage is applied across a test probe (indicated by the caption) and in series with another resistor 30 to the input of an ideal rectifier 31. This ideal rectifier 31 is made up of the integrated circuit element 12 in series with a rectifying diode 32. Together, the integrated circuit 12 and the diode 32 form an ideal rectifier, i.e. the rectifier 31 by including a feedback connection 35, as illustrated.

The rectified voltage is then applied to the integrated circuit 13 at one input thereof through a resistor 36. The integrated circuit 13 is connected as a fixed gain amplifier which has two inputs as illustrated. One of these inputs goes over an input circuit connection 39, and the other goes over another input connection 40. The amplifier has an output circuit connection 41 which goes to one end of a variable resistor 44, the other end of which goes to a micro-ammeter 45.

It is to be noted that the indication which ammeter 45 provides is a direct function of current through the inhibitor film, and an inverse function of film impedance.

It will be observed that there is a common ground circuit connection 48. The potential of this ground circuit is intermediate between a negative voltage which will appear at a terminal 49 and a positive voltage which will appear at a terminal 50. Such ground potential is accomplished by having a circuit connection 51 which joins the common ground circuit 48 and goes to the middle or neutral point between two sources of emf, i.e. batteries 55 and 56.

The other input circuit connection 40, of the amplifier 13 provides an adjustable signal for calibrating zero output as indicated by the micro ammeter 45. This is accomplished by having a pair of resistors 59 and 60 which are connected as indicated. The resistor 59 is connected between common ground connection 48 and the input circuit connection 40. While, the resistor 60 is connected in series with a slider 61 of a potentiometer 62. The fixed resistor of potentiometer 62 is connected across both batteries 55 and 56 by circuit connections 65 and 66, respectively. One reason for this is so that when the batteries are connected into the circuit to supply power, adjustment of the slider 61 will provide an input signal to the integrated circuit amplifier 13 in order to offset any non-zero input on the other input of the amplifier 13. This provides for adjusting the zero point of the test instrument.

A switch 70 is employed for connecting the power on or off. It employs a pair of switch blades or contacts 71 and 72 which make up a double pole single throw switch. Preferably, the switch 70 is arranged with a spring bias (not shown) which holds the contacts 71 and 72 open so that the power supply is connected only when desired for operation and will be disconnected otherwise.

A measurement procedure entails the following simple steps. First of all, with the test probe circuit open the switch 70 is closed, and the slider 61 of potentiometer 62 is adjusted to bring the ammeter 45 reading to zero. This calibrates the zero setting for the instrument. Next, the step of calibrating for full scale reading is carried out by making a short circuit connection between the probe circuit connector 27 and another circuit connector 75 that goes to the other electrode of the test probe indicated. The connector 75 also goes to the input connection of the ideal rectifier 31 and one end of the resistor 30. With the test probe electrodes (circuit connection 27 and 75) short circuited, the adjustable resistor 44 is adjusted until the micro ammeter 45 reads full scale. This then calibrates the full scale or zero resistance measurement which would indicate a complete breakdown of the film of inhibitor.

Then following the calibration, a next step is that of immersing a metallic probe in the liquid of a corroding system. It will be understood that this involves the mounting of a probe in any feasible manner so that its metallic surface is in contact with the liquid which has corrosion inhibitor added thereto.

Another step is that of electrically insulating the probe from a metallic container for the liquid. This, of course, could be done by manually holding the probe, but it would usually involve the structure employed in mounting the probe permanently or removably on the container. Typical structure of such a mounting is illustrated in FIG. 2 of the drawings.

Then a step of applying a low voltage AC square wave voltage across the inhibitor film, is carried out by closing the switch 70. As indicated above, the voltage will have an amplitude of less than that which would damage the film.

When the switch 70 is closed, the meter 45 will read the signal that corresponds to the film resistance. This constitutes the step of measuring the resistance of the film. After taking such a reading the instrument may be disconnected following release of the switch 70, and a further measurement at another probe or location may be carried out in the same manner.

FIG. 2 illustrates a typical probe structure which may be used in a tank or pipe line, or other container of the fluid which has the inhibitor added thereto for overcoming corrosive conditions. The probe illustrated is constructed by taking a conventional pipe plug 76 and drilling a centrally located hole 77 therethrough. In this case, the probe consists of a cylindrical steel rod 80 that will be immersed in the fluid to be tested. A thin rod 81 forms an electrical connector or terminal of the probe. This rod 81 is threaded into one end of the rod 80 and extends out through a top hexagonal portion 84 of the plug 76. The rod 81 is held insulated from the body of the plug 76 by having a pair of insulating washers 85 and 86 mounted near the ends of the rod 81. These hold the rod 81 centrally located in the hole 77. The indicated parts are held securely in place by having a nut 89 screwed onto threads 90 at the free end of the rod 81. It makes contact with the upper insulating washer 85.

While it may not affect the results, it is preferable for the probe to be connected when taking a measurement, with connector 27 of the FIG. 1 circuit leading to the electrode rod 81 of the probe. The other circuit connection 75 goes to the circuit ground or body portion of the plug 76. It will be understood that when the probe is in place it makes secure electrical contact with the pipe or tank that is having the fluid thereof measured for effectiveness of the inhibitor.

It will be understood by one skilled in the art that while the integrated circuits 11, 12 and 13 are illustrated without showing any circuits for going to the potential source, the positive and negative potentials will be taken from the terminals 50 and 49, respectively, and so there will be connections (not shown) to each of the integrated circuits.

It will be clear that in order to carry out a method according to this invention, the particular test instrument illustrated might be employed, or other apparatus could be used to accomplish the same functions. The method involves the following steps, as indicated above. A step of immersing a metallic probe in the liquid which has corrosion inhibitor added, the effectiveness of which is to be determined. This step may be accomplished using a probe as illustrated in FIG. 2 by inserting the plug 76 into a matching hold that is threaded to receive the outer pipe threads on the plug 76.

Another step is that of electrically insulating the probe from a container for the liquid. This is, of course, carried out in any feasible manner such as the mounting of the probe element 80 as shown in the FIG. 2 illustration. It is done using insulating washers 85 and 86. This will insulate the probe from the container. Of course, the plug is not insulated from the container since it is mounted by inserting the plug with good mechanical connections between threads thereof and the container.

A next step is that of applying a low voltage AC square wave voltage across the film that is created on the probe in the fluid being measured. This, of course, may be carried out with an instrument according to the FIG. 1 illustration, or another comparable source of the required AC square wave voltage. It will be noted that the voltage employed must have an amplitude of less than that which will damage the film. The instrument illustrated in FIG. 1 will clearly accomplish this step.

A final step is that of measuring the resistance of the film. The instrument illustrated in FIG. 1 makes such resistance measurement by the indication of the micro-ammeter 45. It is a proportional current measurement that relates directly to the resistance of the film at the probe portion of the circuit.

While the frequency of the AC voltage applied might vary, it is preferably about 100 hertz and the purpose is that of avoiding polarization effects of a DC current flow.

In regard to the construction of a probe to be used in connection with this invention, it will be appreciated that various other geometric configurations may be employed in addition to that illustrated in FIG. 2. Thus, depending on the particular corroding system, the form of the probe might vary. For example, it might be in the form of a tube, or a flat probe, or the like. It might also be found that the probe itself might be made of a special material, should this be required.

While particular embodiments of the invention have been described above in considerable detail in accordance with the applicable statutes, this is not to be taken as in any way limiting the invention but merely as being descriptive thereof.

I claim:

1. Test instrument for measuring effectiveness of a corrosion inhibitor in a corroding system, comprising
   an oscillator for generating an AC signal across a voltage divider,
   circuit means for connecting a predetermined portion of said AC signal to the input of an ideal rectifier through a film of said inhibitor, and
   means for amplifying the output of said ideal rectifier to measure the flow of AC current through said film.

2. Test instrument according to claim 1, wherein
   said ideal rectifier comprises an amplifier in series with a rectifier and a feed back connection around both to compensate for the loss in said last named rectifier.

3. Test instrument according to claim 2, further comprising
   an ammeter connected to said amplifying means for indicating said measure of the flow of AC current through said film.

4. Test instrument for measuring effectiveness of a corrosion inhibitor in a corroding system, comprising
   a solid-state oscillator employing an integrated circuit with a plurality of resistors and a capacitor to generate a square wave output of about eight volts at about one hundred hertz,
   a voltage divider connected across the output of said oscillator to reduce said output to about eight tenths volt,
   an ideal rectifier including an integrated circuit amplifier in series with a diode rectifier and having a feed back connection around both said amplifier and rectifier to compensate for the loss in said last named rectifier,
   a second integrated circuit amplifier having two inputs and an output,
   one of said amplifier inputs being connected to the output of said ideal rectifier,
   the other of said amplifier inputs being connected to an adjustable signal for calibrating the zero output of said instrument, and
   a micro-ammeter connected to the output of said second integrated circuit amplifier to indicate said inhibitor effectiveness.

5. Test instrument according to claim 4, further comprising
   a variable resistor connected in series with said micro-ammeter to adjust for calibrating the full scale reading.

6. Method of measuring corrosion inhibitor effectiveness by determining impedance of a film formed by said inhibitor on a metallic surface contacted by a liquid containing said inhibitor, comprising
   immersing a metallic probe in said liquid,
   electrically insulating said probe from a container for said liquid,
   applying a low voltage AC square wave voltage across said film,
   said voltage having an amplitude of less than that which will damage said film, and measuring the resistance of said film.

7. Method according to claim 6, wherein
   said voltage has a frequency of about one hundred hertz.

* * * * *